US009520621B2

(12) United States Patent
Fink

(10) Patent No.: US 9,520,621 B2
(45) Date of Patent: Dec. 13, 2016

(54) METHOD FOR DETECTING A TRIGGERING OF A SECURITY DEVICE

(75) Inventor: Holger Fink, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 218 days.

(21) Appl. No.: 14/124,379

(22) PCT Filed: Jun. 4, 2012

(86) PCT No.: PCT/EP2012/060463

§ 371 (c)(1), (2), (4) Date: Dec. 6, 2013

(87) PCT Pub. No.: WO2012/168169

PCT Pub. Date: Dec. 13, 2012

(65) Prior Publication Data

US 2014/0120389 A1 May 1, 2014

(30) Foreign Application Priority Data

Jun. 9, 2011 (DE) ........................ 10 2011 077 311

(51) Int. Cl.
*H02J 7/00* (2006.01)
*H01M 10/42* (2006.01)
(Continued)

(52) U.S. Cl.
CPC .......... *H01M 10/425* (2013.01); *B60L 3/0046* (2013.01); *G01R 31/3627* (2013.01);
(Continued)

(58) Field of Classification Search
CPC ........ H02J 7/0004; H02J 9/061; H02J 7/0003; H02J 7/0011; H02J 7/0031; H02J 7/007; H02J 7/0073; H02J 7/0026; H02J 7/0093; H02J 2007/0039; H02J 2007/0098; H02J 7/0008; H02J 7/0029; H02J 7/0044; H02J 2007/0001; H01M 10/44; H01M 6/5011; H01M 10/425; H01M 10/4285; H01M 16/00; H01M 2004/021; H01M 2/0255; H01M 6/5033
(Continued)

(56) References Cited

U.S. PATENT DOCUMENTS

| | | | | |
|---|---|---|---|---|
| 5,563,494 | A | 10/1996 | Cuesta et al. | |
| 2005/0077878 | A1* | 4/2005 | Carrier | B25F 5/00 320/134 |

(Continued)

FOREIGN PATENT DOCUMENTS

| | | | |
|---|---|---|---|
| DE | 694 11 232 | T2 | 11/1998 |
| DE | 100 56 972 | A1 | 5/2002 |

(Continued)

OTHER PUBLICATIONS

International Search Report corresponding to PCT Application No. PCT/EP2012/060463, mailed Jul. 26, 2012 (German and English language document) (7 pages).

*Primary Examiner* — Binh Tat
(74) *Attorney, Agent, or Firm* — Maginot, Moore & Beck LLP

(57) ABSTRACT

The disclosure relates to a method for detecting a triggering of a security device. The security device is associated with a battery cell and is triggered if a security-critical situation is present in the battery cell. Initially an actual time path of a parameter of the battery cell is detected. At the same time, an expected time path of the parameter is determined, in particular using a model. Then, the actual time path is compared to the expected time path of the parameter. Finally, based on the comparison, it is determined whether to trigger the security device or not.

9 Claims, 2 Drawing Sheets

22
i
T
21
u
24
$du_M/dt$
$u_M$
t
27
28
du/dt
23
25
26

(51) Int. Cl.
*H01M 2/34* (2006.01)
*H01M 10/44* (2006.01)
*H01M 10/48* (2006.01)
*B60L 3/00* (2006.01)
*G01R 31/36* (2006.01)

(52) U.S. Cl.
CPC ............. *H01M 2/34* (2013.01); *H01M 2/348* (2013.01); *H01M 10/44* (2013.01); *H01M 10/443* (2013.01); *H01M 10/48* (2013.01); *H01M 10/486* (2013.01); *G01R 31/3651* (2013.01)

(58) Field of Classification Search
USPC .................................................. 320/137–148
See application file for complete search history.

(56) References Cited

U.S. PATENT DOCUMENTS

| | | | | |
|---|---|---|---|---|
| 2010/0013439 | A1* | 1/2010 | Altman | H02J 9/061 320/139 |
| 2010/0185405 | A1 | 7/2010 | Aoshima et al. | |
| 2010/0188086 | A1* | 7/2010 | Lazar | G01R 33/3628 324/318 |

FOREIGN PATENT DOCUMENTS

| | | | |
|---|---|---|---|
| DE | 10 2008 010 971 | A1 | 8/2009 |
| DE | 10 2009 040 146 | A1 | 3/2011 |
| DE | 10 2010 045 904 | A1 | 5/2011 |

* cited by examiner

METHOD FOR DETECTING A TRIGGERING OF A SECURITY DEVICE

This application is a 35 U.S.C. §371 National Stage Application of PCT/EP2012/060463, filed on Jun. 4, 2012, which claims the benefit of priority to Serial No. DE 10 2011 077 311.8, filed on Jun. 9, 2011 in Germany, the disclosures of which are incorporated herein by reference in their entirety.

The present disclosure relates to a method for identifying triggering of a safety device which is associated with a battery cell, and also to a battery management unit in which the method according to the disclosure can be executed.

BACKGROUND

Battery systems comprise rechargeable electrical energy stores which are widely used in portable consumer devices and other applications, for example in partially or exclusively electrically operated vehicles. In automotive applications, battery systems and, in particular, lithium-ion battery systems are considered to be a key technology for electrifying the drive system of vehicles. In this case, battery systems and, in particular, lithium-ion battery systems can be of modular construction, depending on the specified use, and usually comprise a plurality of battery cells which are electrically interconnected in series or in parallel.

An important aspect for this technology to become successfully established is, amongst others, the operational reliability of the battery systems, especially of the lithium-ion battery systems which are often operated with large capacitances. In this case, it is necessary to operate the battery system within an optimum temperature range. This is because the battery temperature has a great deal of influence on the provision of power, aging, service life and operational reliability of the battery system. In order to ensure this, battery systems usually have a sophisticated thermal management concept.

During operation of battery systems, the temperature in the battery may increase in such a way that said battery can no longer be cooled by external cooling systems. The main causes of temperature profiles of this kind are internal short-circuits in the battery, for example caused by physical deformations of the battery or by contamination during production of the battery (for example damage to the separator by particles). An internal short-circuit can set in motion further irreversible electrochemical processes in the battery in which heat is released (exothermic reactions). Finally, so-called thermal runaway, a kind of self-accelerated overheating, can result, and this can lead to the overpressure safety valve bursting and toxic gases being expelled or even to the battery cells exploding. Another possible cause of irreversible temperature increases in a battery is overcharging of the battery.

Battery systems usually have safety devices which serve to prevent thermal runaway of the battery system. The objective of this is to identify the risk of irreversible overheating in good time and possibly to rapidly disconnect the battery from the rest of the power supply system. By way of example, safety devices which suppress a current through the battery cell at an elevated internal pressure, which is produced in the case of an elevated temperature in the battery cell, so-called CIDs (Current Interactive Devices), are integrated in battery cells with a relatively large storage capacity, typically of more than 3 ampere hours. Said CIDs provide protection in the case of overloading due to excessively high charging or discharging currents and overloading due to an external short-circuit, these causing thermal runaway, but not in the case of other causes, in particular in the case of an internal short-circuit which is caused by mechanical deformation, particles or dendrites. A further serious disadvantage of safety devices of this kind is that, when they are triggered, the electronics used for monitoring the individual battery cells or for determining the state of charge can be damaged and the entire system can enter an undefined state. A cause of damage to the electronics when a current interruptive device is triggered is that the associated voltage detection means or voltage monitoring means is acted on by high negative voltages which, in a battery which is used in vehicles, can easily amount to several hundred volts. The electronic components used can be protected against such loading only with a considerable amount of expenditure. Therefore, measures of this kind are generally dispensed with for reasons of economy.

In lithium-ion battery cells, novel safety devices are integrated instead, said safety devices internally short-circuiting when they are triggered, this overcoming the abovementioned disadvantages. At the same time, a battery state identification means has to be provided, said battery state identification means identifying triggering of these novel safety devices so that the battery system can be moved to a safe state.

SUMMARY

The disclosure provides a method for identifying triggering of a safety device. In said method, the safety device is associated with a battery cell and is triggered when there is a safety-critical situation in the battery cell. An actual time profile of a characteristic variable of the battery cell is first detected. At the same time, an expected time profile of the characteristic variable is determined, in particular using a model. The actual time profile of the characteristic variable is then compared with the expected time profile of the characteristic variable.

Finally, a decision is made, on the basis of the comparison, as to whether the safety device has been triggered.

In this way, a battery state identification means is provided which identifies triggering of a safety device, which is typically integrated in a battery cell, and therefore allows a battery management system to move the battery system comprising the battery cell to a safe state. In comparison to the prior art, in which current can no longer flow into the battery cells after a safety device is triggered, the method can also be applied to novel safety devices which require further identification of the triggering of the safety device.

The method can therefore be applied to safety devices which short-circuit the battery cells which are associated with them in a safety-critical situation, in particular in the case of elevated internal pressure or in the case of a mechanical deformation of the battery cell. The method can also be applied to safety devices which bridge the battery cells which are associated with them in a safety-critical situation, in particular in the case of an elevated internal pressure in the battery cell. The method according to the disclosure has the advantage that it is typically based on the evaluation of signals which are present a battery-monitoring battery management unit in any case or can be detected or determined with a low level of expenditure.

In a preferred embodiment of the disclosure, provision is made for an actual change in the characteristic variable over time to be compared with an expected change in the characteristic variable. The characteristic variable is particularly preferably the change in a voltage of the battery cell over time. In this case, the decision can be made that the safety device has been triggered when the actual change in the voltage of the battery cell over time deviates considerably from the expected change in the voltage over time. It is further preferred for the expected change in the voltage of the battery cell over time to be determined using a battery module in which a battery current which flows through the battery cell and/or a temperature of the battery cell are/is taken into consideration. The battery module is typically configured as an observer system, wherein the actual time profile of the voltage is supplied to the battery model.

Further aspects of the disclosure relate to a battery management unit in which the method according to the disclosure can be executed, and also to a battery which comprises the battery management unit according to the disclosure. The battery is preferably a lithium-ion battery. More specifically, the apparatuses battery cell, battery management unit and battery which are essential within the scope of the disclosure can be a rechargeable battery cell, a rechargeable battery management unit and a rechargeable battery.

A further aspect of the disclosure relates to a motor vehicle which comprises the battery according to the disclosure.

BRIEF DESCRIPTION OF THE DRAWINGS

Exemplary embodiments of the disclosure will be explained in greater detail with reference to the drawings and the following description. In the drawings.

DETAILED DESCRIPTION

Figure 1:
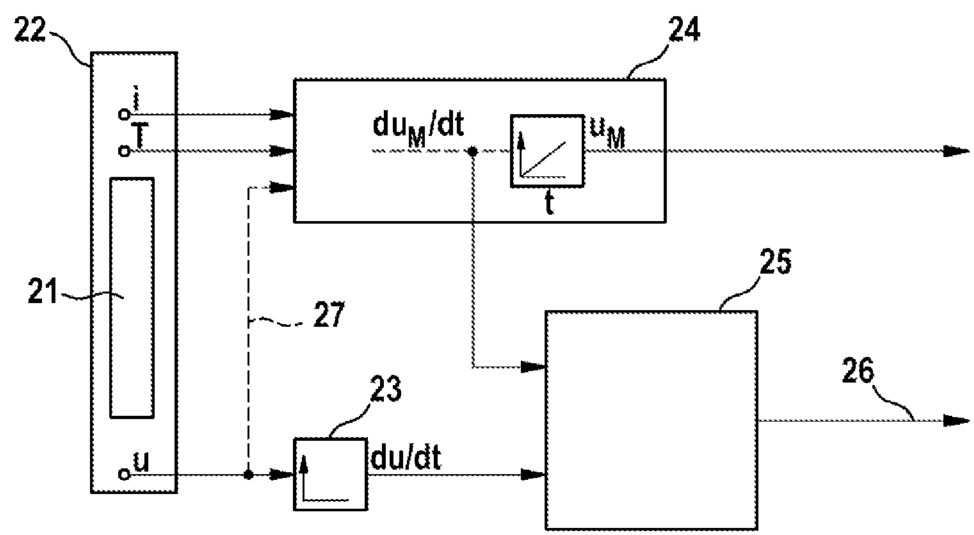
FIG. 1 shows a block diagram of a battery state identification means according to a first form of the method according to the disclosure.

FIG. 1 shows a block diagram of a battery state identification means according to a first form of the method according to the disclosure. A safety device 21 is integrated in a battery cell 22 and short-circuits the battery cell 22 in a safety-critical situation, in particular in the case of an elevated internal pressure in or in the case of a mechanical deformation of the battery cell 22. In a detection unit 23, a voltage u of the battery cell 22 is continuously measured and the actual change in the voltage du/dt over time is determined from this measurement. At the same time, an expected change in the voltage $du_M/dt$ over time is determined in a model unit 24. This is done by a battery current i and a battery temperature T being supplied to the model unit 24. These are used by the model unit 24 to calculate the expected time profile of the voltage $u_M$ of the battery cell 22 and the change $du_M/dt$ in said voltage over time. The model unit 24 is designed, in particular, as an observer unit to which the actual voltage u of the battery cell 22 is continuously supplied. As a result, the calculated battery module can be continuously updated by the expected time profile of the voltage being matched to the actual profile.

The actual change in the voltage du/dt over time which is determined by the detection unit 23 and the expected change in the voltage $du_M/dt$ over time which is calculated by the model unit 24 are supplied to an evaluation unit 25. The evaluation unit 25 continuously compares the two values with one another and identifies triggering of the safety device (26) when the actual change in the voltage du/dt of the battery cell 22 over time is considerably lower than the expected change $du_M/dt$ in the voltage of the battery cell 22 over time, since in this way it can be concluded that there is a short-circuit in the battery cell 22.

Figure 2:
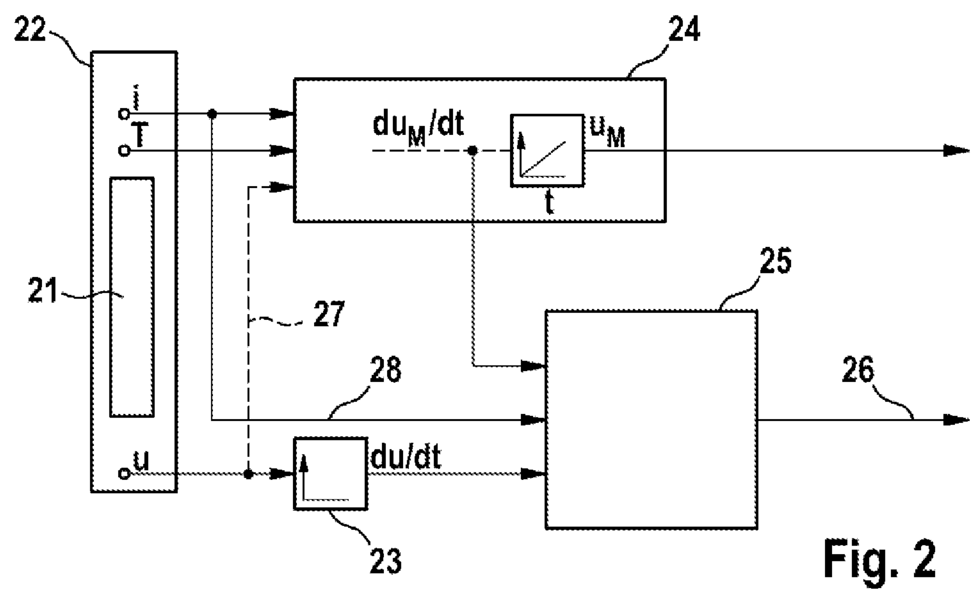
FIG. 2 shows a block diagram of a battery state identification means according to a second form of the method according to the disclosure.

FIG. 2 shows a block diagram of a battery state identification means according to a second form of the method according to the disclosure. In contrast to the embodiment which is illustrated in FIG. 1, provision is made in the embodiment illustrated in FIG. 2 for a signal for the battery current i to additionally be supplied (28) to the evaluation unit 25. As a result, an increase in the robustness of the evaluation in the evaluation unit 25 is possible since the battery current i provides additional information about the state of the battery cell 22. For example, during charging of the battery cell 22, a positive change in the voltage $du_M/dt$ of the battery cell 22 over time is to be expected. If, however, a negative change in the voltage du/dt over time occurs across the battery cell 22, it can be concluded by the evaluation unit 25 that there is a short-circuit and therefore triggering of the safety device 22.

Figure 3:
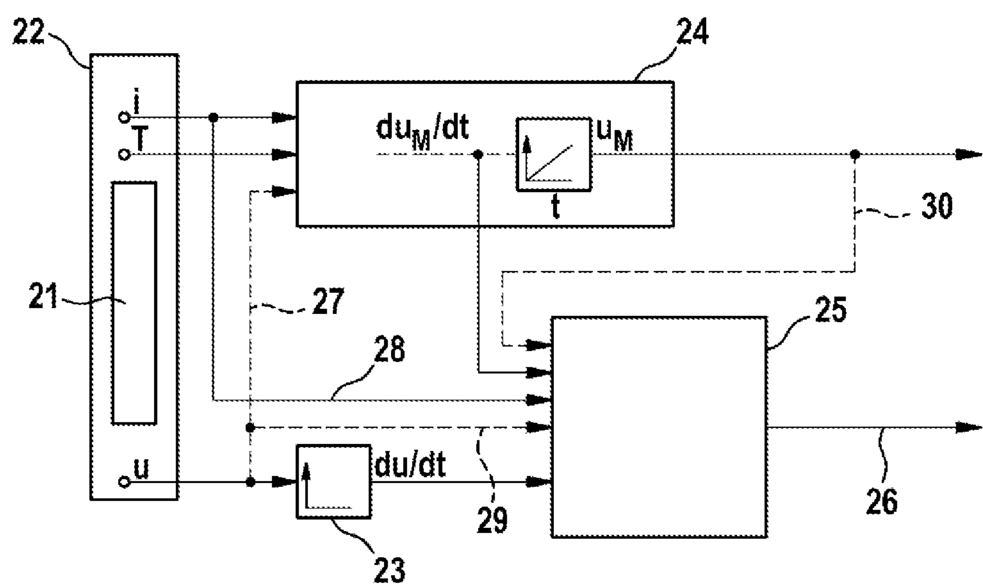
FIG. 3 shows a block diagram of a battery state identification means according to a third form of the method according to the disclosure.

FIG. 3 shows a block diagram of a battery state identification means according to a third form of the method according to the disclosure. The third embodiment of the disclosure which is illustrated in FIG. 3 differs from the second embodiment of the disclosure which is illustrated in FIG. 2 in that the actual voltage u (29) and the expected voltage $u_M$ (30) are additionally continuously supplied to the evaluation unit 25. The robustness of the prediction of triggering of the safety device 21 can be considerably improved by evaluating the information about the actual and the expected voltage of the battery cell 22, in particular the difference between said variables. If, for example, a very low-resistance short-circuit occurs in the battery cell 22, the voltage of the battery cell 22 immediately drops significantly. This briefly causes a high negative value of the actual change in the battery voltage du/dt over time. Without the additional information about the voltage of the battery cell 22, the evaluation unit could perceive this as an interference signal. However, a short-circuit, and therefore triggering of the safety device 21, can be easily identified from the difference between the two voltages u and $u_M$.

The embodiments of the disclosure which are illustrated in FIGS. 1 to 3 can also be used with slight modifications for the case in which the safety device 21, in a safety-critical situation, in particular in the case of an elevated internal pressure in the battery cell 22, bridges said battery cell. In contrast to the short-circuit, the battery cell 22 is therefore not discharged after triggering of the safety device 21 in this case. Therefore, the actual voltage u of the battery cell 22 no longer changes or changes only slightly. The actual change in the voltage du/dt of the battery cells 22 over time therefore exhibits the value zero or at least a value of very low magnitude. If, in contrast, the expected change in the voltage $du_M/dt$ of the battery cell 22 over time has appreciable magnitudes on account of a charging or discharging process, triggering of the safety device 21 can again be concluded.

The invention claimed is:

1. A method for identifying triggering of a safety device, wherein the safety device is associated with a battery cell and is triggered when there is a safety-critical situation in the battery cell, comprising:

detecting an actual time profile of a voltage of the battery cell;

determining an expected time profile of the voltage using a model;

comparing the actual time profile of the voltage with the expected time profile of the voltage by comparing an actual change in the voltage over time with an expected change in the voltage over time; and making a decision, on the basis of the comparison, as to whether the safety device has been triggered, the decision being made that the safety device has been triggered when the actual change in the voltage over time deviates by more than a predefined amount from the expected change in the voltage over time.

2. The method as claimed in claim 1, further comprising:

moving a battery system, which includes the battery cell, to a safe state when triggering of the safety device has been identified.

3. The method as claimed in claim 1, wherein:

the safety device short-circuits the battery cell in the safety-critical situation, and the safety-critical situation includes at least one of (i) an elevated internal pressure in the battery cell and (ii) a mechanical deformation of the battery cell.

4. The method as claimed in claim 1, wherein:

the safety device bridges the battery cell in the safety-critical situation, and the safety-critical situation includes an elevated internal pressure in the battery cell.

5. The method as claimed in claim 1, wherein the expected change in the voltage of the battery cell over time is determined using a battery module configured to take into consideration at least one of (i) a battery current which flows through the battery cell and (ii) a temperature of the battery cell.

6. The method as claimed in claim 5, wherein:

the battery module is configured as an observer system, and the actual time profile of the voltage is supplied to the battery model.

7. The method as claimed in claim 1, wherein a battery management unit is configured to execute the method.

8. A battery comprising:

at least one battery cell;

at least one safety device which is associated with the at least one battery cell and is configured to be triggered when there is a safety-critical situation in the at least one battery cell; and a battery management unit configured to identify the triggering of the at least one safety device by (i) detecting an actual time profile of a voltage of the at least one battery cell, (ii) determining an expected time profile of the voltage using a model, (iii) comparing the actual time profile of the voltage with the expected time profile of the voltage by comparing an actual change in the voltage over time with an expected change in the voltage over time, and (iv) making a decision, on the basis of the comparison, as to whether the at least one safety device has been triggered, the decision being made that the safety device has been triggered when the actual change in the voltage over time deviates considerably from the expected change in the voltage over time.

9. An electric motor vehicle, comprising:

a battery including at least one battery cell, at least one safety device, and a battery management unit, the at least one safety device is associated with the at least one battery cell and is configured to be triggered when there is a safety-critical situation in the at least one battery cell, the battery management unit is configured to identify the triggering of the at least one safety device by (i) detecting an actual time profile of a voltage of the at least one battery cell, (ii) determining an expected time profile of the voltage using a model, (iii) comparing the actual time profile of the voltage with the expected time profile of the voltage by comparing an actual change in a voltage over time with an expected change in the voltage over time, and (iv) making a decision, on the basis of the comparison, as to whether the at least one safety device has been triggered, the decision being made that the safety device has been triggered when the actual change in the voltage over time deviates considerably from the expected change in the voltage over time.

* * * * *